US010656311B2

(12) United States Patent
Ndukaife (10) Patent No.: US 10,656,311 B2
(45) Date of Patent: May 19, 2020

(54) DIRECTED ASSEMBLY OF NANOPARTICLES WITH LIGHT AND ELECTRIC FIELD

(71) Applicant: Vanderbilt University, Nashville, TN (US)

(72) Inventor: Justus C. Ndukaife, Nashville, TN (US)

(73) Assignee: Vanderbilt University, Nashville, TN (US)

( * ) Notice: Subject to any disclaimer, the term of this patent is extended or adjusted under 35 U.S.C. 154(b) by 0 days.

(21) Appl. No.: 16/364,991

(22) Filed: Mar. 26, 2019

(65) Prior Publication Data

US 2019/0302326 A1 Oct. 3, 2019

Related U.S. Application Data

(60) Provisional application No. 62/648,738, filed on Mar. 27, 2018.

(51) Int. Cl.
*G01N 21/55* (2014.01)
*G02B 5/00* (2006.01)
*G01N 21/552* (2014.01)
*B81C 1/00* (2006.01)

(52) U.S. Cl.
CPC .......... *G02B 5/008* (2013.01); *B81C 1/00206* (2013.01); *G01N 21/554* (2013.01); *G02F 2202/30* (2013.01)

(58) Field of Classification Search
CPC .... G01N 21/474; G01N 21/57; G01N 21/553; G01N 21/55; G01N 21/554

USPC .......................................................... 356/445
See application file for complete search history.

(56) References Cited

U.S. PATENT DOCUMENTS

2011/0033887 A1* 2/2011 Fang ................. B01L 3/502707
435/41
2014/0204372 A1* 7/2014 Pang ..................... G01N 21/658
356/301

OTHER PUBLICATIONS

Quidant et al. "Surface-plasmon-based optical manipulation" Laser & Photon. Rev. 2, p. 47-57, Feb. 2008.
Quidant "Plasmonic tweezers—the strength of surface plasmons" Materials Research Society Bulletin, vol. 37, p. 739-744, Aug. 2012.
(Continued)

*Primary Examiner* — Md M Rahman
(74) *Attorney, Agent, or Firm* — Michael Best & Friedrich LLP (57) ABSTRACT

A nanotweezer comprises a first metastructure including a first substrate, a first electrode, and a plurality of plasmonic nanostructures; a second metastructure including a second substrate and a second electrode, wherein the second substrate and the second electrode are substantially transparent to light within a wavelength range; a microfluidic channel between the first metastructure and the second metastructure; a voltage source configured to selectively apply an electric field between the first electrode and the second electrode a light source configured to selectively apply an excitation light to the microfluidic channel, the excitation light having a wavelength within the wavelength range. In response to the selective application of the electric field and/or the excitation light, nanoparticles within the microfluidic channel are manipulated.

22 Claims, 8 Drawing Sheets

(56) References Cited

OTHER PUBLICATIONS

Grigorenko et al., "Nanometric optical tweezers based on nanostructured substrates" Nature Photon., vol. 2, p. 365-370, Jun. 2008.
Tanaka et al. "Nanostructured potential of optical trapping using a plasmonic nanoblock pair" Nano Letters, Apr. 2, 2013, p. 2146-2150.
Kang, J.-H. et al. "Low-power nano-optical vortex trapping via plasmonic diabolo nanoantennas" Nature Communications, 2, 582 (2011).
Juan et al. "Self-induced back-action optical trapping of dielectric nanoparticles" Nature Physics vol. 5, Dec. 2009, p. 915-919.
Roxworthy, B. J. et al. "Application of plasmonic bowtie nanoantenna arrays for optical trapping, stacking, and sorting" Nano Letters 2012, 12, p. 796-801.
Shoji, T. et al. "Reversible photoinduced formation and manipulation of a twodimensional closely packed assembly of polystyrene nanospheres on a metallic nanostructure" Journal of Physical Chemistry C 2013, 117, p. 2500-2506.
Roxworthy et al. "Multifunctional plasmonic film for recording near-field optical intensity" Nano Letters, 14, 4687-4693 (2014).
Baffou et al. "Photoinduced heating of nanoparticle arrays" ACS Nano vol. 7, No. 8, p. 6478-6488, 2013.
Roxworthy et al. "Understanding and controlling plasmon-induced convection" Nature Communications, 5, 3173 (2014).
Ploschner et al. "Optical forces near a nanoantenna" Journal of Nanophotonics, vol. 4, 041570, Feb. 4, 2010.
Donner et al. "Plasmon-assisted optofluidics" ACS Nano 5, 5457-5462 (2011).
Wang et al. "Trapping and rotating nanoparticles using a plasmonic nano-tweezer with an integrated heat sink" Nature Communications 2, 469 (2011).
Huidobro et al. "Plasmonic Brownian ratchet" American Physical Society Review B 88, 201401 (2013).
Ndukaife et al. "Photothermal heating enabled by plasmonic nanostructures for electrokinetic manipulation and sorting of particles" ACS Nano vol. 8 No. 9, p. 9035-9043 (2014).
Hansen et al. "Nano-optical conveyor belt, part I: theory" Nano Letters 14, 2965-2970 (2014).
Zheng et al. "Nano-optical conveyor belt, Part II: demonstration of handoff between near-field optical traps" Nano Letters 14, 2971-2976 (2014).
Juan et al. "Plasmon nano-optical tweezers" Nature Photonics vol. 5, 349-356 (2011).
Melcher "Electric fields and moving media" IEEE Transactions on Education vol. -17, No. 2, p. 100-110 (1974).
Baffou et al. "Mapping heat origin in plasmonic structures" The American Physical Society Review Letters, 104, 136805 Apr. 2010.
Ramos et al., "Ac electrokinetics: a review of forces in microelectrode structures" Journal of Physics D: Applied Physics, vol. 31, (1998) pp. 2338-2353.
Lide, D. R. (ed.) in CRC Handbook of Chemistry and Physics, 84th edn, 2003-2004, section 6-13, 990. (CRC Press, 2003).
Santiago et al. "A particle image velocimetry system for microfluidics" Experiments in Fluids 25, 316-319 (1998).
Parthasarathy et al. "Electrorheology: mechanisms and models" Materials Science and Engineering R Reports, 17, 57-103 (1996).
Williams et al. "Electrokinetic patterning of colloidal particles with optical landscapes" Lab on a Chip 8, 1879-1882 (2008).
Kumar et al. "3D3C velocimetry measurements of an electrothermal microvortex using wavefront deformation PTV and a single camera" Microfluid Nanofluid, 10, 355-365 (2011).
Benson, "Assembly of hybrid photonic architectures from nanophotonic constituents" Nature, vol. 480, 193-199 (2011).
Schietinger et al. "Plasmon-enhanced single photon emission from a nanoassembled metal-diamond hybrid structure at room temperature" Nano Letters vol. 9, No. 4., 1694-1698 (2009).
Yeh et al., "Assembly of ordered colloidal aggregrates by electric-field-induced fluid flow," Nature, vol. 386, No. 6620, pp. 57-59, Mar. 1997.
Squires et al., "Induced-charge electro-osmosis," J. Fluid Mech, vol. 509, pp. 217-252, 2004.
Ashkin et al. "Optical Trapping and Manipulation of Single Cells Using Infrared Laser Beams" Letters to Nature, vol. 330 24/31 pp. 769-771 (1987).
Tsuboi "Plasmonicoptical tweezers: A long arm and a tight grip." Nature Nanotechnology, vol. 11 (2016), pp. 5-6.
Chou et al., "Plasmonic nanostructures for light trapping in organize photovoltaic devices" Royal Society of Chemistry, Nanoscale, 6 (2014) pp. 8444-8458.
Wang et al. "Plasmonic Trapping with a Gold Nanopillar" ChemPhysChem, 13, (2012) pp. 2639-2648.
Saleh et al. "Toward Efficient Optical Trapping of Sub-10-nm Particles with Coaxial Plasmonic Apertures" Nano Letters (2012) pp. 5581-5586.
Yuanjie et al., "Optical Trapping of a Single Protein", Nano Letters American Chemical Society, 2012, 12, pp. 402-406.
Berthelot et al. "Three dimensional manipulation with scanning near-field optical nanotweezers" Nature Nanotechnology, vol. 9, (2014) pp. 295-299.
Yanik et al. "An Optofluidic Nanoplasmonic Biosensor for Direct Detection of Live Viruses from Biological Media" Nano Letters 10 (2010), pp. 4962-4969.
Liu et al. "Nanoantenna-enhanced gas sensing in a single tailored nanofocus" Nature Materials vol. 10 (2011), pp. 631-636.
Belkin et al. "Plasmonic Nanopores for Trapping, Controlling Displacement, and Sequencing of DNA" ACS Nano, vol. 9 No. 11, (2015), pp. 10598-10611.
Aouani et al. "Third-harmonic-upconversion enhancement from a single semiconductor nanoparticle coupled to a plasmonic antenna" Nature Nanotechnology vol. 9 (2014), pp. 290-294.
Ndukaife et al. "Plasmonics—turning loss into gain" Science, vol. 351, Issue 6271, (2016) pp. 334-335.

* cited by examiner

DIRECTED ASSEMBLY OF NANOPARTICLES WITH LIGHT AND ELECTRIC FIELD

CROSS-REFERENCE TO RELATED APPLICATIONS

This application claims priority to U.S. Provisional Application No. 62/648,738, filed with the United States Patent and Trademark Office on Mar. 27, 2018, the contents of which are herein incorporated by reference in their entirety.

BACKGROUND

1. Field of the Disclosure

This application relates generally to the optical manipulation of nanoscale objects. More specifically, this application relates to a hybrid electrothermoplasmonic nanotweezer, and to the long-range and rapid transport of individual nano-objects thereby.

2. Description of Related Art

Plasmonic nanoantennas that can create localized and intensified electromagnetic fields have been studied as candidates for the efficient trapping and manipulation of nanoscale objects, which cannot be resolved with diffraction-limited optical tweezers. Among the issues in this area is how to deliver a single suspended particle towards a given plasmonic nanoantenna where it would be trapped by optical gradient forces. There have been two main approaches employed for the trapping of nanoparticles with plasmonic nanoantennas.

The first approach involves illuminating periodic arrays of closely spaced plasmonic nanoantennas. In this approach, collective heating produces strong fluid convection and thermophoresis, which exerts drag forces on the particles. Despite a relatively fast (~1 μm/s) fluid motion, this technique suffers from the issue of particle agglomeration, which prevents plasmonic trapping of individual nano-objects at a given plasmonic hotspot. Additionally, a complete and consistent study of any synergistic effect of heat-induced and optical-gradient forces affecting the motion of suspended particles presents theoretical and experimental challenges, and thus has not yet been developed.

The second approach involves the illumination of a single plasmonic nanostructured element: a resonant plasmonic nanoantenna. Here, collective heating is absent and the temperature is localized at the illuminated nanoantenna. As a result, the thermoplasmonic convection is weak (<10 nm/s), and the trapping force is primarily provided by the optical gradient force of the nanoantenna. The motion of the suspended particles becomes diffusion-limited, and only particles in close proximity to the plasmonic nanoantenna can be effectively trapped. In this manner, individual nanoparticles can be addressed but at the cost of reduced control over the suspended particles, thus preventing use in low-concentration and high-speed applications.

Accordingly, there exists a need for a nanotweezer capable of rapidly delivering individual nano-objects to a given illuminated nanoantenna on-demand and achieving high-resolution trapping of such objects, without persistent perturbing convection and thermophoretic forces.

BRIEF SUMMARY OF THE DISCLOSURE

Various aspects of the present disclosure relate to devices, systems, and methods for the long-range and rapid transport of individual nano-objects by a hybrid electrothermoplasmonic nanotweezer.

In one exemplary aspect of the present disclosure, there is provided a nanotweezer, comprising: a first metastructure including a first substrate, a first electrode, and a plurality of plasmonic nanostructures; a second metastructure including a second substrate and a second electrode, wherein the second substrate and the second electrode are substantially transparent to light within a predetermined wavelength range; a microfluidic channel between the first metastructure and the second metastructure; a voltage source configured to selectively apply an electric field between the first electrode and the second electrode; and a light source configured to selectively apply an excitation light to the microfluidic channel, the excitation light having a wavelength within the predetermined wavelength range.

In another exemplary aspect of the present disclosure, there is provided a method, comprising: providing a nanotweezer, comprising: a first metastructure including a first substrate, a first electrode, and a plurality of plasmonic nanostructures, a second metastructure including a second substrate and a second electrode, wherein the second substrate and the second electrode are substantially transparent to light within a predetermined wavelength range, and a microfluidic channel between the first metastructure and the second metastructure; selectively applying an electric field between the first electrode and the second electrode; and selectively applying an excitation light to the microfluidic channel, the excitation light having a wavelength within the predetermined wavelength range.

In this manner, various aspects of the present disclosure provide for improvements in at least the technical fields of quantum photonics, as well as the related technical fields of energy production, biosensing, nano-assembly, label-free DNA sequencing, quantum computing, material characterization, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as circuit configurations, waveform timings, circuit operations, and the like, in order to provide an understanding of one or more aspects of the present disclosure. It will be readily apparent to one skilled in the art that these specific details are merely exemplary and not intended to limit the scope of this application.

Overview and ETP Principles

To resolve the aforementioned issues and realize a nanotweezer capable of rapidly delivering individual nano-objects to a given illuminated nanoantenna on-demand and achieving high-resolution trapping of such objects, without persistent perturbing convection and thermophoretic forces, the present disclosure describes an optofluidic mechanism for generating fluidic transport and particle delivery on-demand by combining the photo-induced heating of a single plasmonic nanoantenna with an alternating current (AC) electric field bias inside of a suspension of particles. In this manner, a microfluidic flow, herein termed electrothermoplasmonic (ETP) flow, is induced to capture suspended particles and rapidly deliver them towards the illuminated nanoantenna on-demand.

The use of closely spaced arrays of plasmonic nanoantennas precludes achieving such on-demand fluid motion due to intrinsic thermoplasmonic convection. However, by employing photo-induced heating of a single plasmonic nanoantenna, on-demand fluid motion can be readily achieved, at least because intrinsic thermoplasmonic convection by a single plasmonic nanoantenna is weak (<10 nm/s). In accordance with the present disclosure, micrometer-per-second nanoparticle transport velocity can be obtained by harnessing the photo-induced heating of a single plasmonic nanoantenna.

Using the ETP effect, the present disclosure describes a hybrid electrothermoplasmonic nanotweezer (HENT), which exploits the synergistic effects of an AC field and localized plasmonic field enhancement, and enables trapping on the timescale of a second. A HENT-based system can also be used for low-power, nanometer-scale assembly. Once the particle (which might be located several micrometers apart from the plasmonic antenna) is delivered and locked into position due to the combined effect of the ETP flow and the localized plasmonic field, the AC field is switched to a temporary direct current (DC) field (or low-frequency AC field below 10 Hz), which permanently immobilizes the particle in the plasmonic hotspot position. After the assembly, both the optical excitation and the DC field can be switched off, while the particle remains in place. This immobilization functionality thus saves power, as the light source no longer has to be on to keep the particle in place. This HENT device is experimentally shown to simultaneously satisfy all of the fundamental features of an ideal nanomanipulator. The trapping performance of the HENT system is fundamentally different from the results presented by other systems, in which only the agglomeration of multiple particles was demonstrated. Among the differences between the present disclosure and other approaches is that the present disclosure provides a global transport mechanism that is capable of engaging particles at remote distances from a given plasmonic nanoantenna and delivering them to the nanoantenna instead of relying on diffusion (Brownian motion) to load the trap.

A hybrid system as described herein comprises a plasmonic nanoantenna resonantly illuminated with light, such that strong light coupling occurs, resulting in a highly localized and enhanced electromagnetic field in the vicinity of the nanoantenna. This highly localized field enhancement (a "plasmonic hotspot") produces a tight trapping potential well for stable trapping of suspended particles that enter the well. Simultaneously, the present disclosure makes use of the intrinsic localized heating of the plasmonic nanoantenna to induce strong fluid flow on-demand to aid in the rapid delivery of particles to the plasmonic trapping sites.

The mechanism for generating this on-demand optofluidic flow is explained as follows. The localized heating of the fluid by the illuminated plasmonic nanoantenna creates a local gradient in the electrical properties of the fluid creates a local gradient in the electrical properties of the fluid. In the presence of these gradients in the fluid's permittivity and electrical conductivity, the application of an AC electric field gives rise to an electrical body force per unit volume in the fluid. For an electrically linear incompressible fluid, the electrical body force per unit volume in the fluid is given by the following expression (1):

$$f = \rho_f E_l - \frac{1}{2}|E_l|^2 \nabla \varepsilon_m \quad (1)$$

In expression (1), $E_l$ is the local electric field, $\rho_f$ is the volume density of induced fee charges, and $\varepsilon_m$ is the permittivity of the fluid medium. A fluid for which the susceptibility is linear is referred to as an "electrically linear" fluid. The motion of the fluid by this electrical body force results in a drag force on the suspended particles that transports them towards the plasmonic nanoantenna hotspots where they will be trapped. In this approach, fluid motion is triggered at will by laser illumination of the plasmonic nanoantenna and the application of an AC electric field. As this ETP flow requires not only laser illumination, but also the presence of an applied AC field, fluidic motion and hence particle transport can be generated on-demand by switching the AC field, and this provides a means to separate the roles of plasmonic trapping force and fluidic drag.

The physics of the ETP flow mechanism may be described by several coupled partial differential equations, which can be solved numerically. For purposes of calculation, the nanoantenna will be assumed as a gold nanostructure with a diameter of 320 nm and a thickness of 130 nm, located on a gold film with a thickness of 140 nm, which is in turn located on a glass substrate. Furthermore, for the purposes of calculation, the laser illumination source will be assumed as a 15 mW laser beam operating at 1064 nm and focused to a spot diameter of 1 μm.

The wave equation for the electric field E around the nanoantenna is provided by the following expression (2):

$$\nabla \times \nabla \times E - k_0^2 \varepsilon(r) E = 0 \quad (2)$$

In expression (2), $k_0 = 2\pi/\lambda$, where $\lambda$ is the free-space wavelength, and $\varepsilon_r = \varepsilon'(r) - i\varepsilon''(r)$ is the complex dielectric permittivity at the illumination frequency. The computed electric field distribution is used to determine the heat source density, which gives the heat dissipated per unit volume according to the following expression (3):

$$q(r) = \frac{1}{2} \text{Re}(J \cdot E) \quad (3)$$

In expression (3), J is the induced current density in the plasmonic nanostructure. The heat source density serves as the source term in the heat diffusion equation for computation of the temperature on the plasmonic nanostructure surface as well as in the surrounding fluid and substrate. The temperature field in the system is determined by solving the steady-state heat equation given by the following expression (4):

$$\nabla \cdot [\kappa \nabla T(r) + \rho c_p T(r) u(r)] = q(r) \quad (4)$$

In expression (4), the first term on the left is the heat conduction term, while the second term is the convection term, which depends on the velocity of the fluid. $T(r)$ and $u(r)$ are the spatial temperature and fluid velocity field, respectively, and the material properties $\kappa$, $\rho$ and $c_p$ are the thermal conductivity, density, and specific heat capacity, respectively.

The velocity field distribution is determined from the solution of the incompressible Navier-Stokes equation given by the following expression (5), where $\nabla \cdot u = 0$:

$$\rho(u(r) \cdot \nabla) u(r) + \nabla p(r) - \eta \nabla^2 u(r) = F \quad (5)$$

The forcing term F describes the force per unit volume acting on the fluid element. The total force per unit volume F acting in the fluid in expression (5) is the combination of the buoyancy force density $F_{buoy}$ and the time-averaged electrical body force $\langle F_{ETH} \rangle$. The buoyancy force density $F_{buoy}$ may be derived from the Boussinesq approximation for buoyancy-driven natural convection, which is given by the following expression (6):

$$F_{buoy} = g \rho_0 \beta(T)[T(r) - T_0] \quad (6)$$

In expression (6), g, $\rho_0$, and $\beta(T)$ are the gravitational constant, density of water, and thermal expansion coefficient of water, respectively. The time-averaged electrical body force $\langle F_{ETH} \rangle$ is triggered by applying an AC electric field to the environment of the illuminated plasmonic nanostructure. Following a perturbative expansion, the time-averaged electrical body force per unit volume $\langle F_{ETH} \rangle$ at frequency $\omega$ can be expressed according to the following expression (7):

$$\langle F_{ETH} \rangle = \frac{1}{2} \varepsilon \left[ \frac{\alpha - \gamma}{1 + (\omega \tau)^2} (\nabla T \cdot E) E - \frac{1}{2} \alpha |E|^2 \nabla(T) \right] \quad (7)$$

In expression (7), $\tau = \varepsilon/\sigma$ is the charge relaxation time; E and a are the fluid permittivity and electrical conductivity, respectively; $\alpha$ is $(1/\varepsilon)(\partial \varepsilon/\partial T)$; and $\gamma$ is $(1/\sigma)(\partial \sigma/\partial T)$. Expression (7) may be expanded into the axial (z direction) and radial (r direction) components as represented by the following expressions (8a) and (8b):

$$\langle F_{ETH} \rangle \hat{z} = \frac{1}{2} \varepsilon E_z^2 \left[ \frac{\sigma^2 \varepsilon (\alpha - \gamma)}{\sigma^2 + \omega^2 \varepsilon^2} - \frac{1}{2} \alpha \right] \left( \frac{\partial T}{\partial z} \right) \hat{z} \quad (8a)$$

$$\langle F_{ETH} \rangle \hat{r} = \frac{1}{4} \varepsilon \alpha E_z^2 \left( \frac{\partial T}{\partial r} \right) \hat{r} \quad (8b)$$

In the above expressions, $\alpha$ and $\gamma$ are given as $-0.004$ K$^{-1}$ and $0.02$ K$^{-1}$, respectively. The electrothermal body force per unit volume is composed of two parts: the first term is the Coulomb force, and the second term is the dielectric force. These forces oppose one another, with the Coulomb force being higher at low frequencies. This additional forcing term is dependent on the square of the applied AC electric field and can be much larger than the buoyancy force that causes convection, depending on the magnitude of the applied AC electric field.

Nanotweezer System

Figure 1:
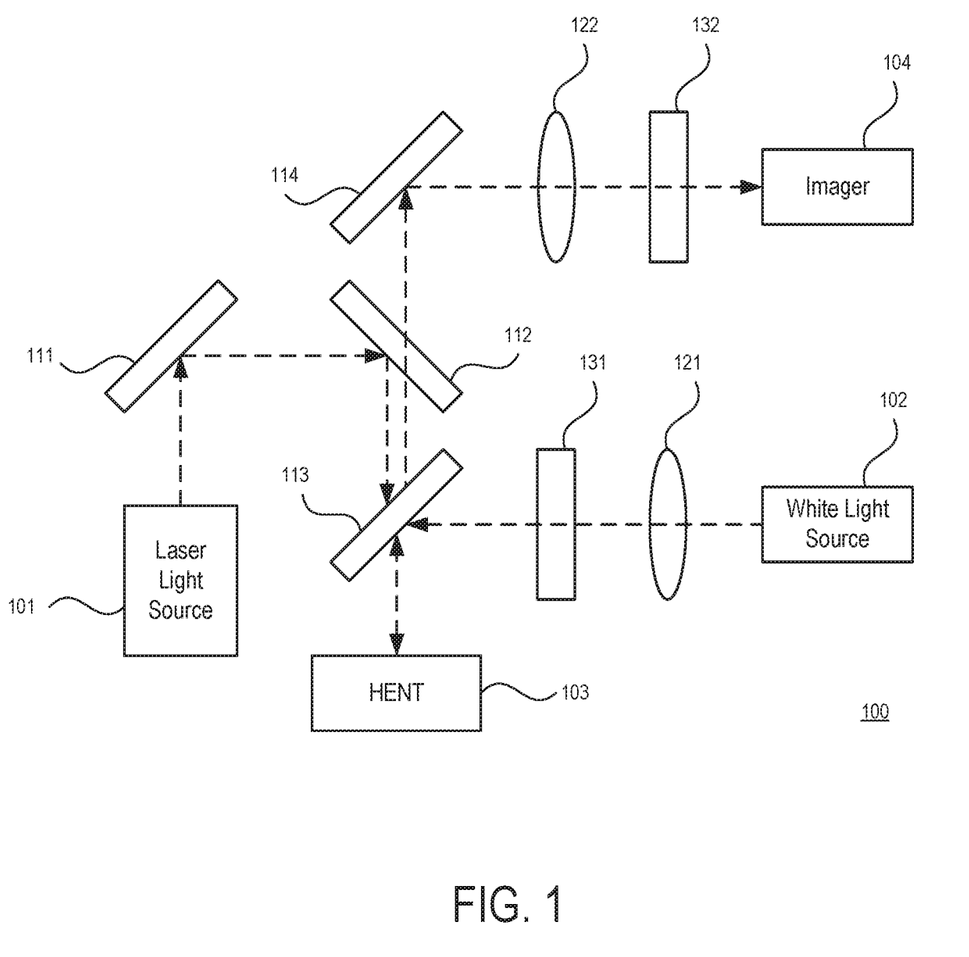
FIG. 1 illustrates an exemplary nanotweezer system in accordance with various aspects of the present disclosure.

FIG. 1 illustrates an exemplary nanotweezer system 100 for implementing the above-described principles. As illustrated in FIG. 1, the nanotweezer system 100 includes a laser light source 101, a white light source 102, a HENT 103, an imager 104, a plurality of dichroic mirrors 111-114, focusing lenses 121-122, and bandpass filters 131-132. In FIG. 1, the laser light source 101 provides an excitation light for illuminating the HENT 103, including a microfluidic channel thereof as will be described in more detail below. The white light source 102 and the imager 104 enable imaging of the motion of suspended tracer particles, for example.

The laser light source 101 may be any light source capable of providing narrow-band light. In some aspects of the present disclosure, the laser light source 101 is an Nd:YAG laser, which emits light having a wavelength of 1064 nm. The white light source 102 may be any light source capable of providing broad-band (white) light that may be used in imaging. In some aspects of the present disclosure, the white light source 102 is a light emitting diode (LED), an organic electroluminescent device (OELD), a superluminescent diode (SLD), an incandescent lamp, a gas discharge lamp, and the like. Furthermore, while FIG. 1 illustrates a particular number and type of various optical components, including four dichroic mirrors, two bandpass filters, and two focusing lenses, in practice the nanotweezer system may have more or fewer optical components in order to deliver light from various sources to corresponding destinations as desired.

The imager 104 may be any device capable of converting incident electromagnetic radiation into electronic signals. For example, the imager 104 may be a Charge-Coupled Device (CCD), a Complementary Metal-Oxide Semiconductor (CMOS) image sensor (CIS), and the like. In some aspects of the present disclosure, the imager 104 may be a smartphone, a digital camera, and the like.

Figure 2:
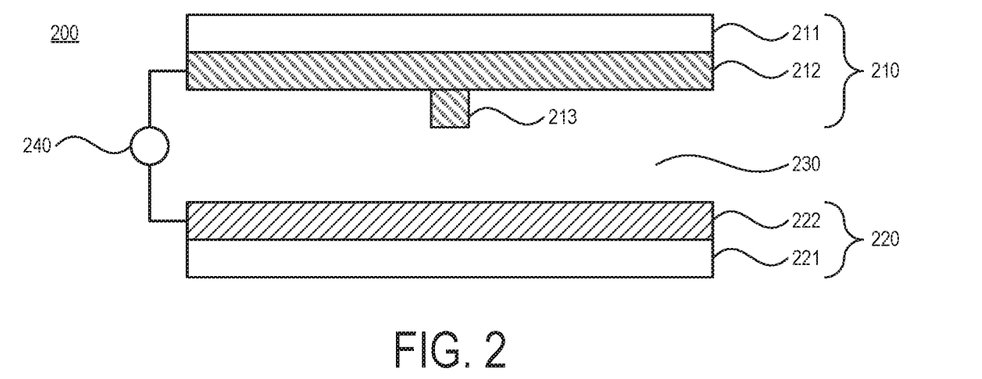
FIGS. 2-4 respectively illustrate partial cross-sectional views of exemplary hybrid electrothermoplasmonic nanotweezers in accordance with various aspects of the present disclosure.
Figure 3:
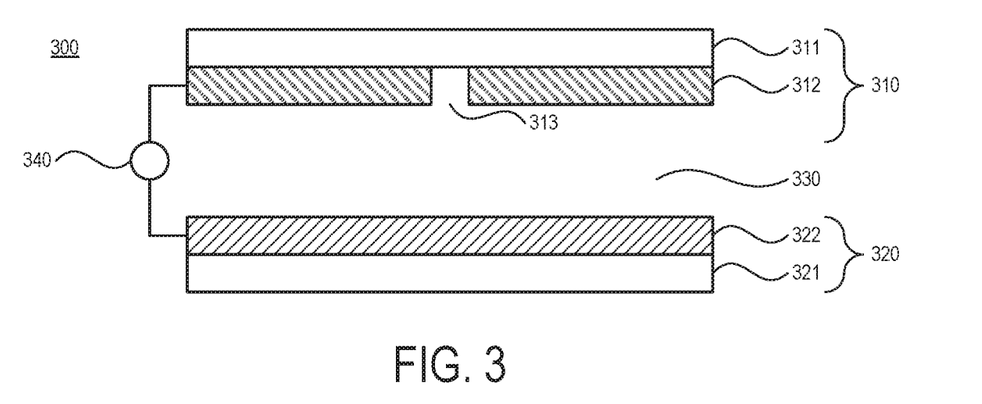
Figure 4:
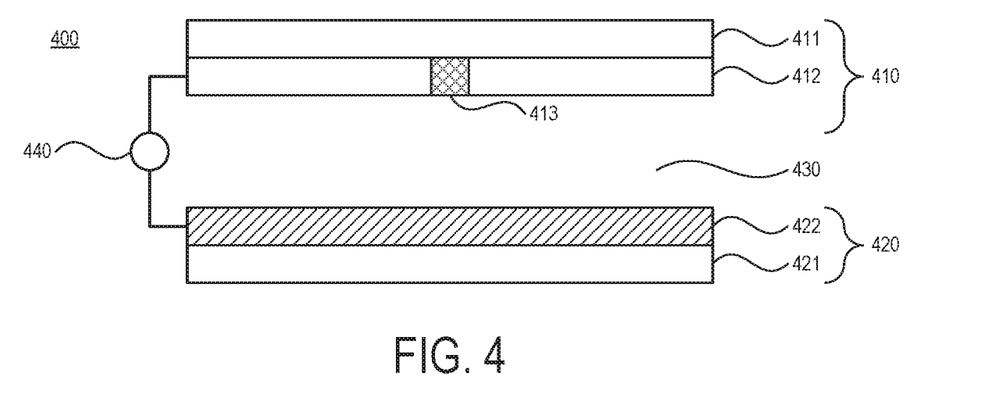

FIGS. 2-4 respectively illustrate partial cross-sectional views of exemplary HENTs, each of which may be examples of the HENT 103 illustrated in FIG. 1. As illustrated in FIG. 2, a HENT 200 includes a first metastructure 210 which includes a first substrate 211, a first electrode 212, and a plasmonic nanopillar 213; a second metastructure 220 which includes a second substrate 221 and a second electrode 222; a microfluidic channel 230 between the first metastructure 210 and the second metastructure 220; and a voltage source 240 which selectively applies an electric field between the first electrode 212 and the second electrode 222. While FIG. 2 illustrates only a single plasmonic nanopillar 213, in practice a plurality of plasmonic nanopillars 213 are disposed.

The second substrate 221 and the second electrode 222 are formed of a material that is substantially transparent to light within a predetermined wavelength range. When included in a nanotweezer system such as the nanotweezer system 100 illustrated in FIG. 1, the predetermined wavelength range includes a wavelength of light from the laser light source 101 and at least a portion of a wavelength of light from the white light source 102. In some examples, the first substrate 211 and the second substrate 221 are respectively formed of a glass. In some examples, the first electrode 212 and the plasmonic nanopillar 213 are formed of a metal, such as gold. While FIG. 2 illustrates the second substrate 221 and the second electrode 222 as separate layers, in some examples the second substrate 221 and the second electrode 222 may be integral. In some examples, the second substrate 221 and/or the second electrode 222 are formed of a substantially (e.g., >90%) transparent metal, such as indium tin oxide (ITO).

As illustrated in FIG. 3, a HENT 300 includes a first metastructure 310 which includes a first substrate 311, a first electrode 312, and a plasmonic nanohole 313; a second metastructure 320 which includes a second substrate 321 and a second electrode 322; a microfluidic channel 330 between the first metastructure 310 and the second metastructure 320; and a voltage source 340 which selectively applies an electric field between the first electrode 312 and the second electrode 322. While FIG. 3 illustrates only a single plasmonic nanohole 313, in practice a plurality of plasmonic nanoholes 313 are disposed.

The second substrate 321 and the second electrode 322 are formed of a material that is substantially transparent to light within a predetermined wavelength range. When included in a nanotweezer system such as the nanotweezer system 100 illustrated in FIG. 1, the predetermined wavelength range includes a wavelength of light from the laser light source 101 and at least a portion of a wavelength of light from the white light source 102. In some examples, the first substrate 311 and the second substrate 321 are respectively formed of a glass. In some examples, the first electrode 312 is formed of a metal, such as gold. While FIG. 3 illustrates the second substrate 321 and the second electrode 322 as separate layers, in some examples the second substrate 321 and the second electrode may be integral. In some examples, the second substrate 321 and/or the second electrode 322 are formed of a substantially (e.g., >90%) transparent metal, such as indium tin oxide (ITO).

As illustrated in FIG. 4, a HENT 400 includes a first metastructure 410 which includes a first substrate 411 and a first electrode 412; a second metastructure 420 which includes a second substrate 421 and a second electrode 422; a microfluidic channel 430 between the first metastructure 410 and the second metastructure 420; and a voltage source 440 which selectively applies an electric field between the first electrode 412 and the second electrode 422. The first electrode 412 is formed of a photoconductive material. The photoconductive material, when illuminated at a particular portion, will generate excess carriers making an electrically conductive nanospot 413. While FIG. 4 illustrates only a single nanospot 413, in practice a plurality of nanospots 413 are disposed. The nanospots 413 may be formed in a particular pattern through the use of a spatial light modulator (SLM). In the presence of a lower frequency (<15 kHz or <20 kHz) AC field and a central heating laser beam, the nanospots 413 will enable the assembly of particles at the boundary defined by the light pattern. The assembly can be reconfigured by varying the shape of the light pattern array using the SLM.

The second substrate 421 and the second electrode 422 are formed of a material that is substantially transparent to light within a predetermined wavelength range. When included in a nanotweezer system such as the nanotweezer system 100 illustrated in FIG. 1, the predetermined wavelength range includes a wavelength of light from the laser light source 101 and at least a portion of a wavelength of light from the white light source 102. In some examples, the first substrate 411 and the second substrate 421 are respectively formed of a glass. While FIG. 4 illustrates the second substrate 421 and the second electrode 422 as separate layers, in some examples the second substrate 421 and the second electrode may be integral. In some examples, the second substrate 421 and/or the second electrode 422 are formed of a substantially (e.g., >90%) transparent metal, such as indium tin oxide (ITO).

While each of FIGS. 2-4 illustrate an exemplary HENT of a bottom-exposure configuration, in which light (excitation light and imaging light, for example) enters the respective microfluidic channel from below, the present disclosure is not so limited. For example, a HENT in accordance with the present disclosure may have a top-exposure configuration, in which light enters the microfluidic channel from above. In this configuration, the respective first metastructure should be substantially (e.g., >90%) transparent to light within the predetermined wavelength range.

In the above configurations, the nanopillar 213, the nanohole 313, and the nanospot 413 are all examples of a plasmonic nanostructure in accordance with the present disclosure. Preferably, a plurality of plasmonic nanostructures are present and are disposed in an array of a particular shape. FIGS. 5-8 illustrate plan views of exemplary HENTs having a plurality of plasmonic nanostructures disposed in an array, each of which may be examples of the HENTs 103, 200, 300, and/or 400 illustrated in FIGS. 1-4.

Figure 5:
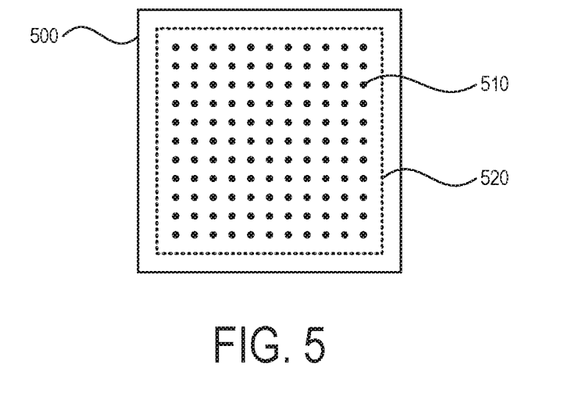
FIGS. 5-8 respectively illustrate plan views of exemplary hybrid electrothermoplasmonic nanotweezers in accordance with various aspects of the present disclosure.
Figure 6:
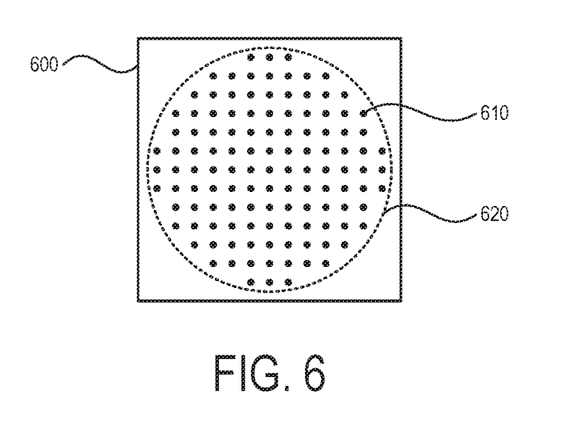
Figure 7:
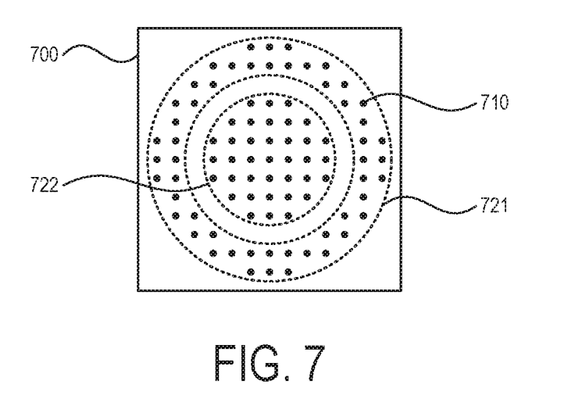

In FIG. 5, a HENT 500 includes a plurality of plasmonic nanostructures 510 disposed in a rectangular array 520. In FIG. 6, a HENT 600 includes a plurality of plasmonic nanostructures 610 disposed in a circular array 620. In FIG. 7, a HENT 700 includes a plurality of plasmonic nanostructures 710 disposed in a first annular array 721 and a second circular array 722, where the first annular array 721 and the second array 722 are concentric and nested.

Varying the geometry of the patterned array molds the distribution of the assembled objects. For example, by using the HENT 600 illustrated in FIG. 6, the assembled objects are formed in a circular distribution at a critical distance around the circumference of the circular array 620. The critical separation distance is dependent on the applied AC field frequency. The assembled nanoparticles can be patterned by applying an AC field frequency below a particular threshold. Through the use of the above arrays, it is possible to arrange nanoparticles according to their size and shape.

Figure 8:
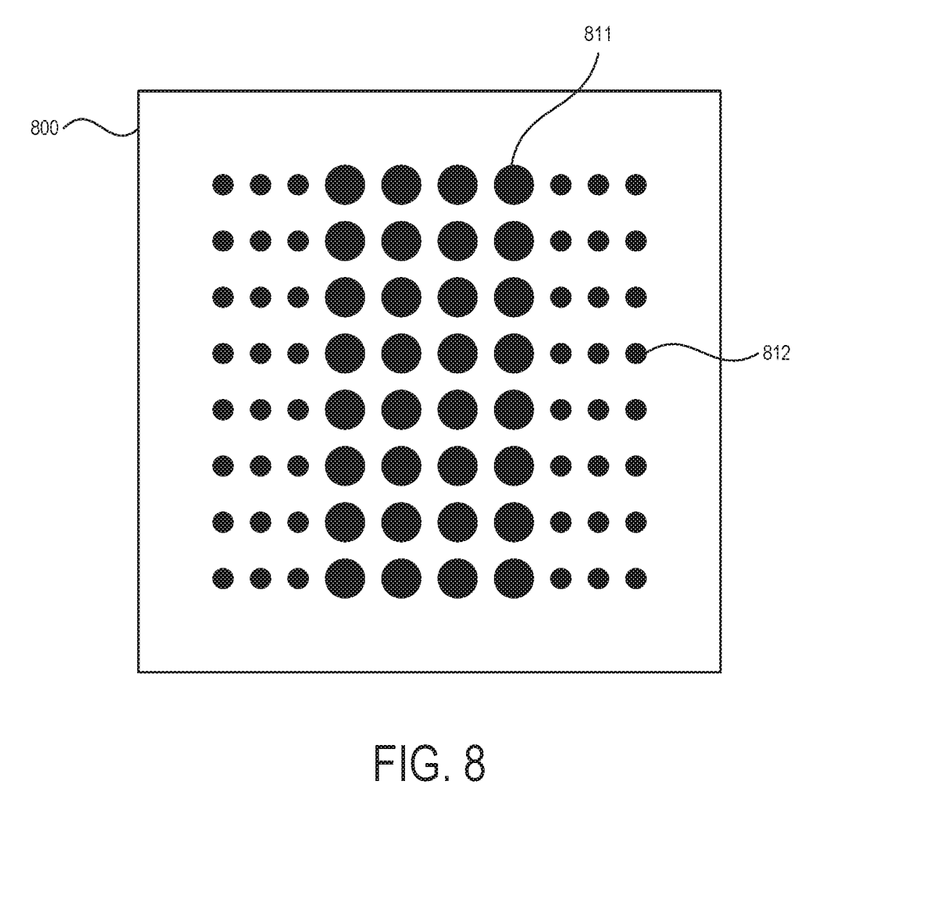

In FIGS. 5-7, each of the plasmonic nanostructures are of a similar or the same size. However, the present disclosure is not so limited. For example, as illustrated in FIG. 8, a HENT 800 may include a plurality of first nanostructures 811 and a plurality of second nanostructures 812 disposed in any array, where respective ones of the plurality of first nanostructures 811 are larger than respective ones of the plurality of second nanostructures 812. In such a configuration, the first nanostructures 811 will distort the AC electric field more than the second nanostructures 812, and will induce the assembly of particles on the array of second nanostructures 812. Regardless of the array shape, after assembly it is possible to supply ligands into the microfluidic channel to thereby bind the assembled nanoparticles together.

Particle Manipulation by the Nanotweezer System

As noted above, the principles of ETP flow may be a tool for on-demand long-range particle transport. Additionally, the principles of ETP flow may be utilized to implement trapping functionality in a HENT, such as any of the HENTs 103, 200, 300, 400, 500, 600, 700, and/or 800 described above. This may be realized through the short-range interaction between an excited nanostructure and a targeted nano-object.

FIGS. 9-14 respectively illustrate partial cross-sectional views of the exemplary HENT 200 of FIG. 2 in various operational modes in accordance with various aspects of the present disclosure, thereby illustrating various examples of particle manipulation. For ease of readability, structural features described above with regard to FIG. 2 are not described again, and their corresponding reference numerals are omitted from FIGS. 9-14. FIGS. 9-14 further illustrate a pair of particles 900 disposed in the microfluidic channel and laser illumination 910. While FIGS. 9-14 illustrate a series of operations being performed at a single nanostructure, the present disclosure is not so limited. For example, a series of operations may be performed at a first nanostructure followed by a series of operations at a second nanostructure. In order to perform various operations at different nanostructures, it is possible to dynamically translate either or both of the excitation light and the nanotweezer itself (for example, using a movable stage) to manipulate the assembled nanoparticles as desired.

Figure 9:
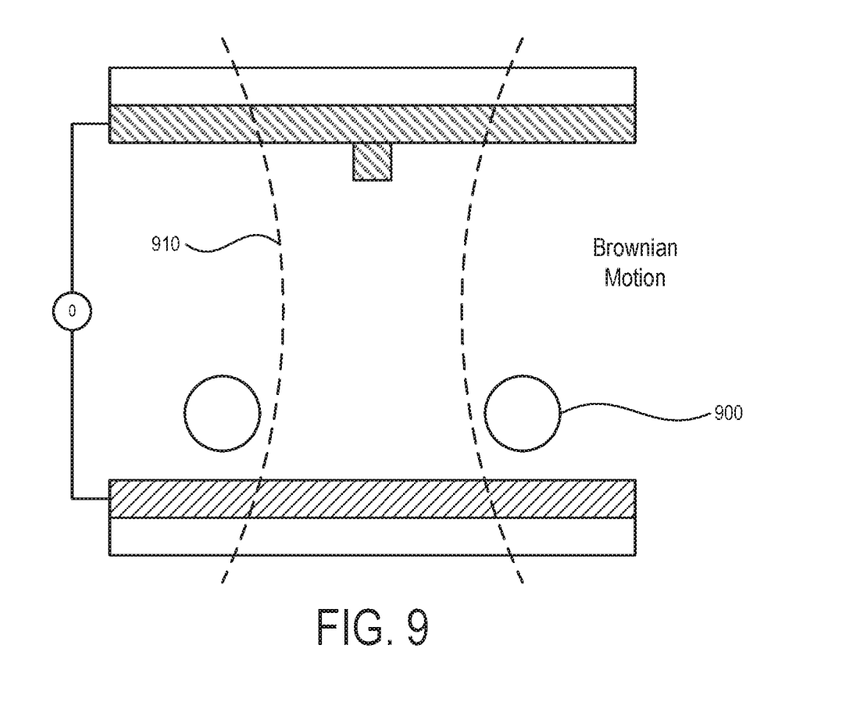
FIGS. 9-14 respectively illustrate partial cross-sectional views of the exemplary hybrid electrothermoplasmonic nanotweezer of FIG. 2 in various operational modes in accordance with various aspects of the present disclosure.
Figure 10:
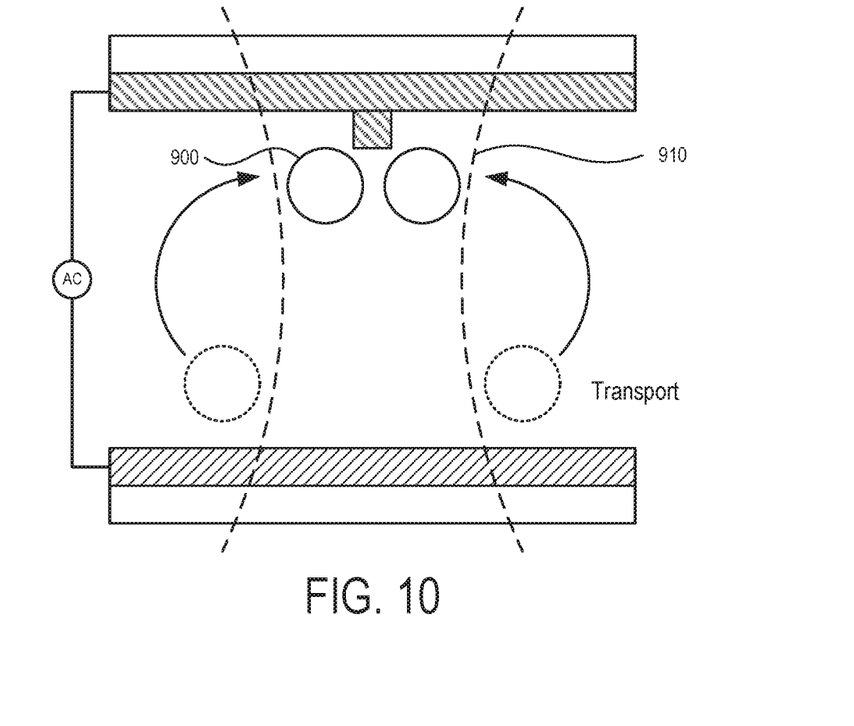

In FIG. 9, the laser illumination 910 is present and the electric field is not present. In this configuration, the particles 900 are undergoing Brownian motion. In FIG. 10, the laser illumination 910 remains present and an AC electric field is applied between the electrodes. This configuration induces ETP flow for rapid delivery of the particles 900 to the plasmonic hotspot.

When the nanostructure is illuminated with the laser illumination 910, the strong coupling with light creates two plasmonic hotspots at the extreme edges of the nanoantenna. These highly localized plasmonic hotspots create short-range optical gradient forces close to the nanoantenna. The gradient force has radial and axial components, denoted as $F_{grad-r}$ (inward) and $F_{grad-z}$ (upward), respectively. Application of an AC electric field actuates ETP flow, which exerts radial and axial drag forces denoted as $F_{etp-r}$ (inward) and $F_{etp-z}$ (downward), respectively. Once brought close to the nanoantenna, short-range optical gradient forces are exerted on the particles 900 to trap them at the hotspot location. In addition to the optical gradient force, another attractive force induced by the AC electric field acts on the particles 900 when they are brought close to the nanoantenna and film surface. This force is referred to as the "particle-electrode interaction" and is denoted as $F_s$, directed upward. This attractive particle-electrode interaction force is the interaction between a polarized particle 900 and its image charge in the electrode. Under this condition, where both the laser illumination 910 and the AC electric field are present, the HENT device is said to be operating in a hybrid mode.

Figure 11:
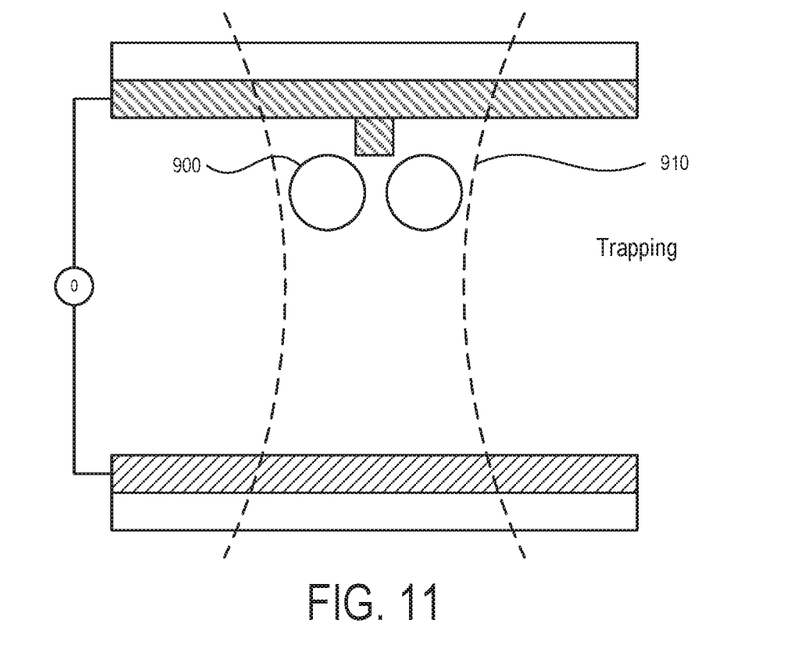
Figure 12:
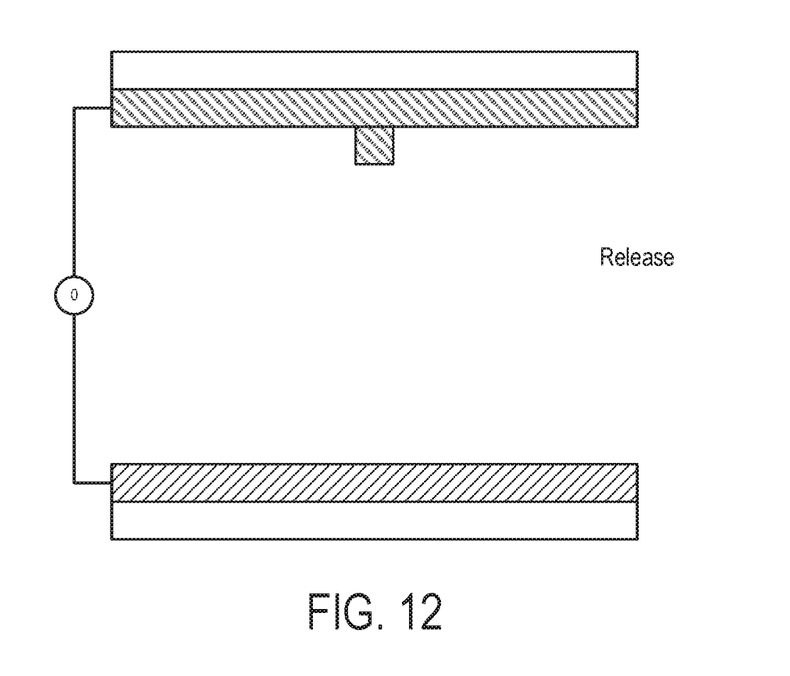

In FIG. 11, the laser illumination 910 remains present and the electric field is once again not present. In this configuration, the particles 900 remain trapped by the optical gradient forces. The forces are strongest at the edges of the nanostructure and the particles 900 can be preferentially trapped at these locations. In addition, by rotating the polarization of the trapping laser beam, it is possible to rotate the plasmonic hotspots and thus rotate the particles 900 delivered to the hotspots. The gradient force also overcomes the repulsive force due to positive thermophoresis to enable trapping. In FIG. 12, the laser illumination 910 is no longer present and the particles 900 are released. Thus, FIGS. 11-12 illustrate the trapping and release of a delivered particle.

Figure 13:
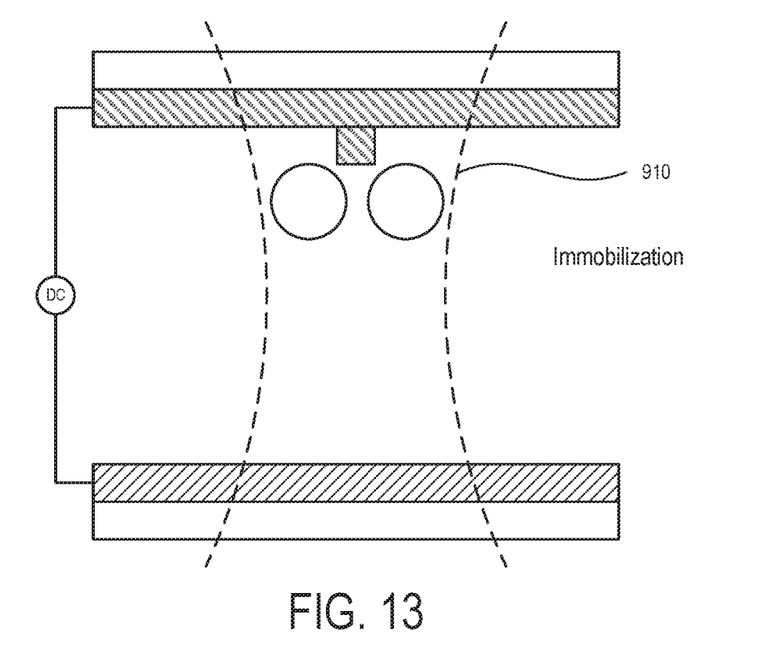
Figure 14:
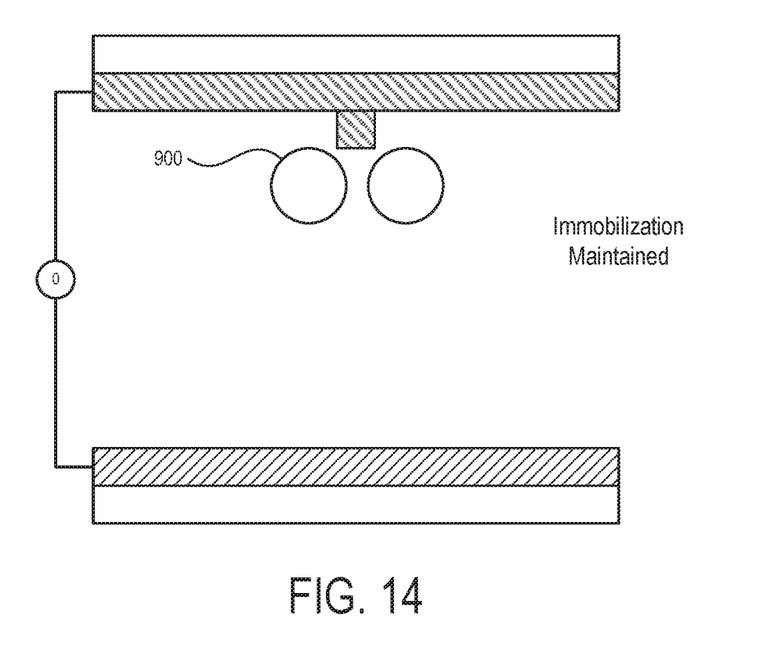

Alternatively, FIGS. 13-14 illustrate the immobilization and holding of a delivered particle. For example, after the configuration of FIG. 10, the laser illumination 910 may remain present and the electric field may be switched from an AC electric field to a DC electric field, as illustrated in FIG. 13. In this configuration, the particles 900 are permanently immobilized at the plasmonic hotspot location. This immobilization is maintained even if the laser illumination 910 and the electric field are no longer present, as illustrated in FIG. 14.

Immobilization occurs for at least the following reasons: when a particle is immersed in a fluid medium, charges of opposite sign ("counterions") are attracted to the surface to screen the surface charge present on the particle. This layer of charge, known as the electrical double layer, is composed of two parts: the Stern layer, where the charges are tightly bound to the particle surface, and a diffuse layer, where the charges or ions are more mobile and have about the same mobility as the solution. The applied DC electric field will cause the ions surrounding the particle to move. The moving ions push the particle towards the surface. As the particles approach closer to the surface, short-range attractive forces such as the van der Waals force begin to dominate to bind the particle on the nanostructure surface.

Experimental demonstration of trapping in a HENT was performed using 300 nm polystyrene particles. Although the HENT would still trap smaller objects, this size was chosen for ease of visualization of the trapping dynamics. As in the calculations above, the nanoantenna was a gold nanostructure with a diameter of 320 nm and a thickness of 130 nm, located on a gold film with a thickness of 140 nm, which is in turn located on a glass substrate. Initially, the nanoantenna was excited with a 1064 nm laser beam. Under this condition, the intrinsic thermoplasmonic convection was weak and, except for random Brownian motion, no net particle flux was observed. An AC field of 80 kV/m at 50 kHz was then applied, and immediately resulted in the creation of ETP flow. The radial component of the ETP flow was directed towards the thermal hotspot of the illuminated nanoantenna and facilitated well-directed delivery of the suspended particles to the plasmonic hotspots. This flow is axi-symmetric with respect to the nanoantenna. In the experimental demonstration, one of the suspended particles was locked in position in less than 2 s. At this point, the system allows for: (1) maintaining the particle in position with minimum energy consumption using only laser excitation; (2) releasing the particle by turning off both the laser and the AC voltage; or (3) immobilizing the nanoparticle in its location by temporarily switching the AC field to a DC field. Option (3) terminated with a final zero-power trapping that required neither the optical nor the electrical biases.

In the hybrid mode (where both the laser illumination and the AC electric field are present), various forces operate to keep delivered particles locked in place even if the AC field is turned off. The various forces and their effects are illustrated in FIG. 15, which illustrates four relationships based on the radial position of the particle.

Figure 15:
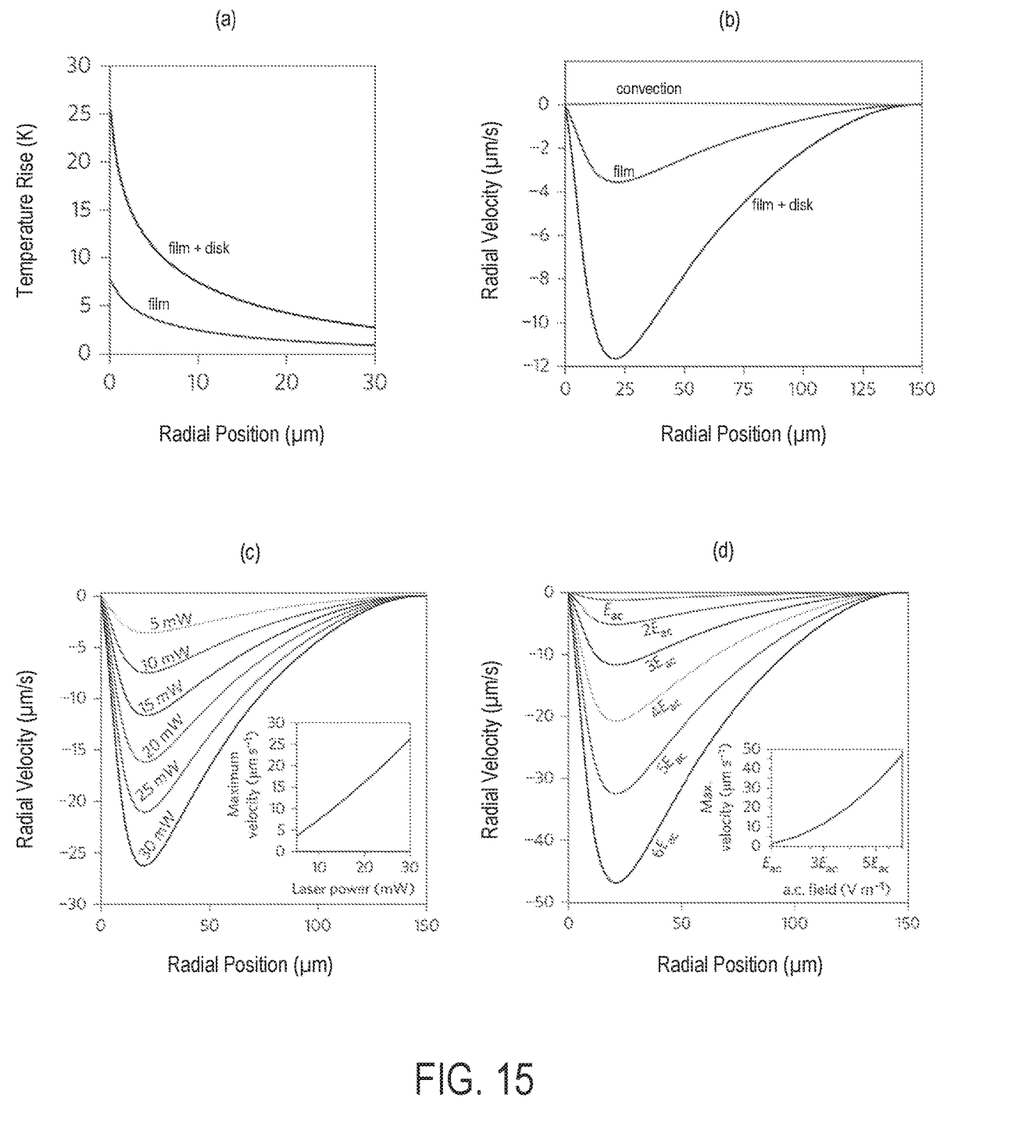
FIG. 15 illustrates an analysis of a hybrid electrothermoplasmonic nanotweezer in accordance with various aspects of the present disclosure.

In FIG. 15, graph (a) illustrates the radial temperature rise in the fluid at a height 250 nm away from the plasmonic nanostructure for two cases: illumination of a gold nanoantenna on a gold film (such as the HENT 200 of FIG. 2) and illumination of a gold film-only system. Graph (b) illustrates the radial velocity component resulting from fast ETP flow and slow thermoplasmonic convection at a distance 7 μm from the gold nanoantenna as compared to a gold film-only system and convection only. The radial flow speed near the electrode with the plasmonic nanoantenna on it initially increases from zero at a radial distance of ~100 μm until it reaches its maximum at a radial distance of ~25 μm from the nanoantenna. This may be attributed to the electrothermal body force acting on the fluid element, which is at its maximum at this radial position. Inward from this point, the radial velocity decreases towards the illuminated nanoantenna until it becomes practically zero at the position of the nanoantenna, which represents a stagnation zone. Thus, particles remote from the nanoantenna and within a radial distance of 100 μm can be captured and transported to the nanoantenna.

The radial flow speed is also affected by the laser power and the applied electric field. Graph (c) of FIG. 15 illustrates the respective radial flow curves for laser powers of 5 mW to 30 mW, in 5-mW increments. Graph (c) also shows, inset, the relationship between the maximum velocity and the laser power. Graph (d) illustrates the radial flow curves for electric field strengths of one to six times a given electric field strength EAC, in unitary increments.

Conclusion and Applications

The above-described techniques provide a method to assemble nanoscale and mesoscale particles and biomolecules with a plasmonic nanostructure array, though the combination of optical illumination and AC electric field application with frequencies typically below 25 kHz. The above-described techniques may achieve size-based sorting by varying the frequency of the applied AC electric field. For example, smaller particles may be displaced farther away from an array whereas larger particles may be grouped closer to the array.

Various aspects of the present disclosure may be practically implemented in several fields. For example, the present disclosure may be applied for on-chip concentration of biological molecules, such as viruses and bacteria, for sensitive detection at low concentrations. In this manner, most biological sensors rely on Brownian diffusion to deliver the biomolecules to the sensing site, which (compared to the above-described techniques) is a very slow process that prolongs the detection time and makes it impossible or impractical to detect low analyte concentrations within reasonable time scales. Biological sensors based on the present disclosure may allow for particles to be concentrated within a few seconds.

Furthermore, the present disclosure may be applied for size-based sorting of colloids or biological particles such as viruses and bacteria. In this manner, the above-described techniques may be applied to separate biological particles based on their size in solution. The present disclosure may also be applied to assemble and create new optical and electronic materials by bonding the assembled colloidal building blocks. As such, the above-described techniques may be used to create new materials such as metamaterials and metasurfaces based on the assembly and bonding of sub-wavelength building blocks.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A nanotweezer, comprising:
    a first metastructure including a first substrate, a first electrode, and a plurality of plasmonic nanostructures;
    a second metastructure including a second substrate and a second electrode, wherein the second substrate and the second electrode are substantially transparent to light within a predetermined wavelength range;
    a microfluidic channel between the first metastructure and the second metastructure;
    a voltage source configured to selectively apply an electric field between the first electrode and the second electrode; and
    a light source configured to selectively apply an excitation light to the microfluidic channel, the excitation light having a wavelength within the predetermined wavelength range, wherein
    the voltage source is configured to operate in an AC-field mode in which an AC electric field is applied between the first electrode and the second electrode, and a DC-field mode in which a DC electric field is applied between the first electrode and the second electrode,
    in the AC-field mode, the plurality of plasmonic nanostructures are configured to deliver a nanoparticle within the microfluidic channel to a location along a surface of the first metastructure in response to the electric field and the excitation light, and
    in the DC-field mode, the plurality of plasmonic nanostructures are configured to immobilize the nanoparticle at the location in response to the electric field.

2. The nanotweezer according to claim 1, wherein the plurality of plasmonic nanostructures are configured to deliver a nanoparticle within the microfluidic channel to a location along a surface of the first metastructure in response to the electric field and the excitation light.

3. The nanotweezer according to claim 1, wherein the plurality of plasmonic nanostructures are configured to trap a nanoparticle within the microfluidic channel in response to the electric field and the excitation light.

4. The nanotweezer according to claim 1, wherein
the voltage source is further configured to operate in a no-field mode in which no electric field is applied between the first electrode and the second electrode, and
in the no-field mode, the plurality of plasmonic nanostructures are configured to trap the nanoparticle at the location in response to the excitation light, and configured to release the nanoparticle in response to an absence of the excitation light.

5. The nanotweezer according to claim 1, wherein respective ones of the plurality of plasmonic nanostructures are nanopillars disposed on the first electrode.

6. The nanotweezer according to claim 1, wherein respective ones of the plurality of plasmonic nanostructures are nanoholes disposed within the first electrode.

7. The nanotweezer according to claim 1, wherein the first metastructure includes a photoconductive material, and respective ones of the plurality of plasmonic nanostructures are light patterns on the photoconductive material.

8. The nanotweezer according to claim 1, wherein a dimension of respective ones of the plurality of plasmonic nanostructures is less than a wavelength of the excitation light.

9. The nanotweezer according to claim 1, wherein the light source is a laser light source.

10. A method comprising:
providing a nanotweezer, the nanotweezer comprising:
a first metastructure including a first substrate, a first electrode, and a plurality of plasmonic nanostructures,
a second metastructure including a second substrate and a second electrode, wherein the second substrate and the second electrode are substantially transparent to incident light within a predetermined wavelength range, and
a microfluidic channel between the first metastructure and the second metastructure;
selectively applying an electric field between the first electrode and the second electrode in an AC-field mode and a DC-field mode; and
selectively applying an excitation light to the microfluidic channel, the excitation light having a wavelength within the predetermined wavelength range, wherein the AC-field mode includes:
applying an AC electric field between the first electrode and the second electrode, and
in response to the AC electric field and the excitation light, delivering at least one nanoparticle within the microfluidic channel to a location along a surface of the first metastructure, and
the DC-field mode includes:
applying a DC electric field between the first electrode and the second electrode, and
in response to the DC electric field and the excitation light, immobilizing the at least one nanoparticle at the location.

11. The method according to claim 10, wherein selectively applying the electric field includes applying a low-frequency AC electric field between the first electrode and the second electrode, the low-frequency AC electric field having a frequency below 10 Hz, the method further comprising:
in response to the low-frequency AC electric field and the excitation light, immobilizing the at least one nanoparticle at the location.

12. The method according to claim 10, wherein
the plurality of plasmonic nanostructures are arranged in an array,
selectively applying the electric field includes applying a low-frequency AC electric field between the first electrode and the second electrode, the low-frequency AC electric field having a frequency below 20 kHz, and
the method further comprises: in response to the low-frequency AC electric field and the excitation light, arranging the at least one nanoparticle around a periphery of the array.

13. The method according to claim 12, wherein
the at least one nanoparticle is a plurality of nanoparticles, and
the method further includes arranging the plurality of nanoparticles according to respective sizes of the plurality of nanoparticles, respective shapes of the plurality of nanoparticles, or both the respective sizes and the respective shapes.

14. The method according to claim 12, wherein
the at least one nanoparticle is a plurality of nanoparticles, and
the method further includes supplying a ligand to the microfluidic channel and binding the plurality of nanoparticles with the ligand.

15. The method according to claim 10, wherein selectively applying the electric field includes applying no electric field between the first electrode and the second electrode, the method further comprising:
in response to the excitation light, trapping the nanoparticle at the location.

16. The method according to claim 15, further comprising:
in response to an absence of the excitation light, releasing the nanoparticle from the location.

17. The method according to claim 10, further comprising dynamically translating the excitation light, the nanotweezer, or both the excitation light and the nanotweezer.

18. The method according to claim 10, wherein respective ones of the plurality of plasmonic nanostructures are nanopillars disposed on the first electrode.

19. The method according to claim 10, wherein respective ones of the plurality of plasmonic nanostructures are nanoholes disposed within the first electrode.

20. The method according to claim 10, wherein the first metastructure includes a photoconductive material, and respective ones of the plurality of plasmonic nanostructures are light patterns on the photoconductive material.

21. The method according to claim 10, wherein a dimension of respective ones of the plurality of plasmonic nanostructures is less than a wavelength of the excitation light.

22. The method according to claim 10, wherein the excitation light is a laser light.

* * * * *